(12) United States Patent
Jung et al.

(10) Patent No.: US 8,409,940 B2
(45) Date of Patent: Apr. 2, 2013

(54) SILICON CRYSTALLIZATION APPARATUS AND SILICON CRYSTALLIZATION METHOD THEREOF

(75) Inventors: Yun Ho Jung, Seoul (KR); Young Joo Kim, Kyonggi-do (KR)

(73) Assignee: LG Display Co., Ltd., Seoul (KR)

( * ) Notice: Subject to any disclaimer, the term of this patent is extended or adjusted under 35 U.S.C. 154(b) by 404 days.

(21) Appl. No.: 12/767,407

(22) Filed: Apr. 26, 2010

(65) Prior Publication Data

US 2010/0255663 A1 Oct. 7, 2010

Related U.S. Application Data

(62) Division of application No. 11/019,353, filed on Dec. 23, 2004, now Pat. No. 7,728,256.

(30) Foreign Application Priority Data

Dec. 24, 2003 (KR) .......................... 10-2003-96578
Dec. 6, 2004 (KR) .......................... 10-2004-101870

(51) Int. Cl.
*H01L 21/00* (2006.01)
(52) U.S. Cl. .......... 438/166; 257/E21.133; 257/E21.134
(58) Field of Classification Search .......... 438/149–167; 257/E29.151, E21.133, E21.134
See application file for complete search history.

(56) References Cited

U.S. PATENT DOCUMENTS

| 5,302,230 | A | * | 4/1994 | Ino et al. .......................... 117/92 |
| 5,913,104 | A | | 6/1999 | Piper et al. |
| 6,027,960 | A | | 2/2000 | Kusumoto et al. |
| 6,486,437 | B2 | | 11/2002 | Tanabe |
| 6,513,796 | B2 | | 2/2003 | Leidy et al. |
| 6,514,339 | B1 | | 2/2003 | Jung |
| 2002/0153360 | A1 | | 10/2002 | Yamazaki et al. |
| 2003/0224550 | A1 | | 12/2003 | Kokubo et al. |

FOREIGN PATENT DOCUMENTS

| CN | 1165972 A | | 11/1997 |
| CN | 1389600 A | | 1/2003 |
| CN | 1427451 A | | 7/2003 |
| JP | 9-21987 A | | 1/1997 |
| JP | 9-138256 A | | 5/1997 |
| JP | 11068109 A | * | 3/1999 |

* cited by examiner

*Primary Examiner* — Brook Kebede
(74) *Attorney, Agent, or Firm* — Birch, Stewart, Kolasch & Birch, LLP

(57) ABSTRACT

A silicon crystallization method renders it is possible to form alignment key without additional photolithography, and to adjust a substrate to a correct position by sensing a deviation of the substrate when the substrate is loaded. The silicon crystallization method includes aligning the substrate by sensing a fixed substrate with a sensing device, and moving and/or rotating a stage, wherein the sensing device faces toward an edge of the substrate to directly sense the edge of the substrate; forming alignment keys on predetermined portions of a non-display area of the substrate by correspondingly placing a mask for formation of an alignment key above the substrate; and crystallizing an amorphous silicon by correspondingly providing a mask for crystallization above the substrate.

21 Claims, 12 Drawing Sheets

SILICON CRYSTALLIZATION APPARATUS AND SILICON CRYSTALLIZATION METHOD THEREOF

CROSS-REFERENCE TO RELATED APPLICATIONS

This application is a Divisional of application Ser. No. 11/019,353 filed on Dec. 23, 2004, now U.S. Pat. No. 7,728,256, and for which priority is claimed under 35 U.S.C. §120; and this application claims priority of Application No. P2003-096578, filed in Korea on Dec. 24, 2003 and Application No. P2004-101870 filed in Korea on Dec. 6, 2004 under 35 U.S.C. §119; the entire contents of all are hereby incorporated by reference as if fully set forth herein.

BACKGROUND OF THE INVENTION

1. Field of the Invention

The invention relates to a silicon crystallization method and a silicon crystallization apparatus, in which it is possible to form an alignment key without additional photolithography, and to adjust the substrate to a correct position by sensing a deviation of the substrate when the substrate is loaded.

2. Discussion of the Related Art

Various displays increase in demand as information technologies develop. Recently, many efforts have been made to research and develop various flat display panels such as a liquid crystal display device (LCD), a plasma display panel (PDP), an electroluminescent display (ELD), a vacuum fluorescent display (VFD), and the like. Some types of the flat display panels have already been used in various display devices.

LCDs are most widely used because of their beneficial characteristics and advantages including high quality images, light weight, thin and compact size, and low power consumption. LCDs can be used as substitutes for cathode ray tubes (CRT) for mobile image display devices. LCDs have also been developed for use in devices receiving and displaying broadcast signals, such as televisions, computer monitors, and the like.

Generally, an LCD device includes an LCD panel for displaying an image and a driving unit for applying driving signals to the LCD panel. The LCD panel includes first and second glass substrates bonded to each other and a liquid crystal layer injected between the first and second substrates.

In this case, on the first glass substrate (TFT array substrate), gate lines are formed to be arranged in one direction at fixed intervals, data lines are arranged perpendicularly to the gate lines at fixed intervals, pixel electrodes are formed in a matrix-type configuration in pixel regions defined by the gate and data lines crossing each other, and thin film transistors are switched by signals of the gate lines to transfer signals from the data lines to the pixel electrodes.

On the second glass substrate (color filter substrate), there is a black matrix layer for shielding light from other portions except the pixel regions. On the second glass substrate can also be found an R/G/B (Red/Green/Blue) color filter layer for realizing colors, and a common electrode for realizing an image.

The above-described first and second glass substrates are maintained at a predetermined interval from each other by spacers, and the substrates are bonded to each other by a sealant having a liquid crystal injection inlet. Liquid crystal material is injected between the two glass substrates.

The general driving principle of an LCD device uses the optical anisotropy and polarization characteristics of the liquid crystal. Because the structure of a liquid crystal molecule is thin and long, the liquid crystal molecules are aligned along a specific direction. Based upon dipole moment, the liquid crystal molecules can have either positive or negative dielectric anisotropy. Applying an induced electric field to the liquid crystal controls the direction of the alignment. Therefore, when the alignment of the liquid crystal molecules is arbitrarily controlled, the alignment of the liquid crystal molecules eventually alters. Subsequently, due to the optical anisotropy of liquid crystals, light rays are refracted in the direction of the alignment of the liquid crystal molecules, thereby representing image information.

In recent technologies, an active matrix liquid crystal display (LCD), which is formed of a thin film transistor and pixel electrodes aligned in a matrix form and connected to the thin film transistor, is considered to have excellent high resolution and is noted for its ability to represent animated images.

In an LCD device having a polysilicon semiconductor layer of the thin film transistor, it is possible to form the thin film transistor and a driving circuit on the same substrate. Also, there is no requirement to connect the thin film transistor with the driving circuit, whereby the fabrication process is simplified. In addition, the field effect mobility of polysilicon is one to two hundred times higher than the field effect mobility of amorphous silicon, thereby obtaining a great stability to temperature and light.

The method of fabricating the polysilicon can be divided into a low temperature fabrication process and a high temperature fabrication process depending upon the fabrication temperature.

The high temperature fabrication process requires a temperature of approximately 1,000° C., which is equal to or higher than the temperature required for modifying substrates. Glass substrates have poor heat-resistance, and hence expensive quartz substrates having excellent heat-resistance should be used. When fabricating a polysilicon thin film by using the high temperature fabrication process, inadequate crystallization may occur due to high surface roughness and fine crystal grains, thereby resulting in poor device characteristics, as compared to polysilicon formed by the low temperature fabrication process. Therefore, technologies for crystallizing amorphous silicon, which can be vapor-deposited at a low temperature to form polysilicon, have been researched and developed.

The method of depositing amorphous silicon at low temperature, and crystallizing the deposited amorphous silicon, can be categorized as a laser annealing process and a metal induced crystallization process.

The low temperature laser annealing process includes irradiating a pulsed laser beam on a substrate. More specifically, by using the pulsed laser beam, the solidification and condensation of the substrate can be repeated about every 10 to 100 nanoseconds. The low temperature fabrication process has the advantage that the damage caused on a lower insulating substrate can be minimized.

The related art crystallization method of silicon using the laser annealing method will now be explained in detail.

FIG. 1 illustrates a graph showing the size of amorphous silicon particles versus laser energy density.

FIG. 1 shows that the crystallization of amorphous silicon can be divided into a first region, a second region, and a third region depending upon the intensity of laser energy.

The first region is a partial melting region where the intensity of the laser energy irradiated on the amorphous silicon layer is sufficient to penetrate only the surface of the amorphous silicon layer. After irradiation, the surface of the amorphous silicon layer partially melts in the first region, and small crystal grains are formed on the surface of the amorphous silicon layer after the solidification process.

The second region is a near-to-complete melting region where the intensity of the laser energy, being higher than that of the first region, almost completely melts the amorphous silicon. After melting, the remaining nuclei are used as seeds for crystal growth to thereby form crystal particles with an increased crystal growth, as compared to the first region. However, the crystal particles formed in the second region are not uniform. The second region has a narrower laser energy density band than the first region.

The third region is a complete melting region where laser energy with an increased intensity, as compared to that of the second region, is irradiated to completely melt the amorphous silicon layer. After the complete melting of the amorphous silicon layer, a solidification process is carried out to allow homogenous nucleation, thereby forming a crystal silicon layer formed of fine and uniform crystal particles.

In this method of fabricating polysilicon, the number of laser beam irradiations, i.e., shots, and the degree of overlap are controlled in order to form uniform, large and rough crystal particles by using the energy density of the second region.

However, the interfaces between the many polysilicon crystal particles act as impediments to electric current flow, thereby decreasing the reliability of the thin film transistor device. In addition, collisions between electrons may occur within the many crystal particles to cause damage to the insulating layer due to the collision current and deterioration, thereby resulting in product degradation or defects. In order to resolve such problems, fabricating polysilicon uses a sequential lateral solidification (SLS) method, where the crystal growth of the silicon crystal particle occurs at an interface between liquid silicon and solid silicon in a direction perpendicular to the interface. The related art SLS crystallizing method is disclosed in detail by Robert S. Sposilli, M. A. Crowder, and James S. Im, Mat. Res. Soc. Symp. Proc. Vol. 452, pp. 956-957, 1997.

In the related art SLS method, the amount of laser energy, the irradiation range of the laser beam, and the translation distance are controlled to permit lateral growth of a silicon crystal particle with a predetermined length, thereby crystallizing the amorphous silicon into a single crystal of 1 μM or more.

The irradiation device used for SLS concentrates the laser beam into a small and narrow region, and the amorphous silicon layer deposited on the substrate thus cannot be completely converted into polycrystalline silicon with a single irradiation. Therefore, in order to change the irradiation position on the substrate, the substrate having the amorphous silicon layer deposited thereon is mounted on a stage. Then, after irradiation on a predetermined area, the substrate is moved so as to allow irradiation to be performed on another area, thereby carrying out the irradiation process over the entire surface of the substrate.

FIG. 2 illustrates a schematic view of a related art sequential lateral solidification (SLS) device. FIG. 2 shows the related art sequential lateral solidification (SLS) device that includes a laser beam generator 1 generating laser beams, a focusing lens 2 focusing the laser beams discharged from the laser beam generator 1, and a mask 3 to dividedly irradiate the laser beam on a substrate 10. A reduction lens 4 formed below the mask 3 reduces the laser beam passing through the mask 3 to a constant width.

The laser beam generator 1 generally produces light with a wavelength of about 308 nanometers (nm) using XeCl or a wavelength of 248 nanometers (nm) using KrF in an excimer laser. The laser beam generator 1 discharges an unmodified laser beam. The discharged laser beam passes through an attenuator (not shown), in which the energy level is controlled. The laser beam then passes through the focusing lens 2.

The substrate 10 has an amorphous silicon layer deposited thereon, and the substrate 10 is fixed on an X-Y stage 5 that faces the mask 3.

In order to crystallize the entire surface of the substrate 10, the X-Y stage 5 is minutely displaced, thereby gradually expanding the crystallized region.

The mask 3 includes an open part 'A' that allows the laser beam to pass through, and a closed part 'B' blocks the laser beam (see FIG. 3). The width of the open part 'A' determines the lateral growth length of the grains foamed after the first exposure.

FIG. 3 shows a plane view of a mask used in a laser irradiation process. FIG. 4 shows a crystallized region formed by a laser beam irradiation by using a mask of FIG. 3. Referring to FIG. 3, the mask used in the laser irradiation process is formed with the open part 'A' having patterns opened at a first interval (a), and the closed part 'B' has patterns closed at a second interval (b). The open and closed parts alternate sequentially.

The laser irradiation process using the mask will be described as follows.

First, the mask 3 is placed over the substrate having an amorphous silicon layer deposited thereon, and then the first laser beam is irradiated. At this time, the irradiated laser beam passes through the multiple open parts 'A' of the mask 3, whereby predetermined portions 22 of the amorphous silicon layer corresponding to the open parts 'A' are melted and liquefied, as shown in FIG. 4. In this case, the intensity of laser energy has a value selected from the complete melting region, so that the silicon layer irradiated with the laser completely melts.

At this time, by a single laser beam irradiation, the multiple open parts 'A' of the mask 3 correspond to one unit area 20 of the substrate, to which the laser beam irradiated, where the unit area 20 has a length 'L' and a width 'S'.

After the laser beam irradiation, silicon grains 24a and 24b grow laterally from interfaces 21a and 21b between the amorphous silicon region and the completely liquefied silicon region, and the grains grow towards the irradiation region. The lateral growth of the silicon grains 24a and 24b proceeds in a perpendicular direction to the interfaces 21a and 21b.

In the predetermined portion 22 irradiated with laser corresponding to the open part 'A' of the mask, if the width of the predetermined portion 22 is narrower than two times the growth length of the silicon grains 24a, then the grains growing inward in a perpendicular direction from both sides of the interface of the silicon region come into contact with one another at a grain boundary 25, thereby causing the crystal growth to stop.

Subsequently, in order to further grow the silicon grains, the stage bearing the substrate is moved to perform another irradiation process on an area adjacent to the first irradiated area. Another crystal thus forms with the new crystal being connected to the crystal formed after the first exposure. Similarly, crystals are laterally formed on each side of the completely solidified regions. Generally, the crystal length produced by the laser irradiation process and connected to the adjacent irradiated part is determined by the width of open part 'A' and closed part 'B' of the mask.

FIG. 5 illustrates an overlapped portion after completing the crystallization process over the entire surface of the substrate by using the mask of FIG. 3.

FIG. 5 shows that on progressing the crystallization by the unit areas (C1, C2, ..., Cm, Cm+1, ...) of the substrate irradiated with shots of the laser beam, there are overlapped portions (01, 02) of laser beam irradiation on the substrate. That is, when irradiating the laser beam at the adjacent unit areas, the predetermined portions between the adjacent unit areas may be irradiated with the laser beam two (or more) times according to the open part 'A' of the mask that partially overlaps the adjacent unit area. For example, the laser beam irradiates in a condition where the substrate is moved along the X-axis direction at a distance corresponding to the length 'L' of the open part of the mask 3, and thus an overlapped portion 01 generates. Also, the laser beam irradiates under the condition where the substrate is moved along the Y-axis direction at the distance corresponding to (a+b)/2 of the mask 3, and thus an overlapped portion 02 generates. Among the overlapped portions 01 and 02, there are the overlapped portions 51 and 52 that are twice irradiated with the laser beam along any one direction of the X-axis or the Y-axis. Also, the overlapped portion 53 is irradiated with the laser beam four times along the X-axis and the Y-axis directions.

If circuit or display components are positioned in the overlapped portions 51, 52, and 53, the electron mobility may decrease due to non-uniformity of grains generated during the silicon crystallization process. Also, the picture quality degrades when the overlapped portions 51, 52, and 53 are in correspondence with the pixel region of display area.

Accordingly, the related art silicon crystallization method has the following disadvantages.

The related art silicon crystallization is performed over the entire surface of the substrate, and the silicon crystallization process proceeds without an additional alignment key. As a result, it is difficult to control the position of laser beam overlapped portions. Accordingly, if the laser beam overlapped portions correspond to the pixel regions or a channel region, it may cause deleterious low picture quality and low operation speed.

Generally, an LCD device is defined as the display area and a non-display area. Also, the predetermined portion of the LCD device requiring silicon crystallization corresponds to the portion having components necessary for rapid operating speed. That is, the portion requiring the silicon crystallization bears the components such as the display area for the driving circuit part (gate driver and data driver), and the non-display area is for the thin film transistor. Accordingly, it is possible to selectively perform the silicon crystallization process to a predetermined portion without applying the silicon crystallization process over the entire surface of the substrate. With the selective silicon crystallization, it is possible to decrease the time and number of laser irradiations. However, for selective silicon crystallization, it becomes necessary to provide an alignment key for sensing the portion of the substrate irradiated with the laser beam. For this, there arises a requirement to perform photolithography to form the additional alignment key, thereby placing a burden on the silicon crystallization process.

SUMMARY OF THE INVENTION

Accordingly, the invention pertains to a silicon crystallization apparatus and a silicon crystallization method that substantially obviates one or more problems due to limitations and disadvantages of the related art.

An object of the invention is to provide a silicon crystallization apparatus and a silicon crystallization method thereof, in which it is possible to form an alignment key without additional photolithography, and to adjust the substrate to a correct position by sensing the deviation of the substrate when the substrate is loaded.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, the invention, in part pertains to a stage for crystallization that includes a moving stage being moved in a horizontal direction; a fixing plate provided in the moving stage to fix a substrate; and a rotating frame provided in the moving stage, to rotate the fixing plate.

The stage for crystallization can further include multiple adsorption pins provided in the fixing plate, for being moved up and down; and a vacuum groove formed in a surface of the fixing plate, so as to adsorb the substrate. The vacuum groove can have a lattice shape.

Also, when the substrate is loaded, the adsorption pins project above the fixing plate so as to fix the substrate, and then the fixing plate is moved down while fixing the substrate, so that the substrate is loaded to the surface of the fixing plate.

Further, when the substrate is unloaded, the adsorption pins project above the fixing plate, so that the substrate is spaced apart from the fixing plate.

The invention, in part, pertains to a silicon crystallization apparatus that includes a stage for fixing a substrate having silicon deposited thereon, and for being rotatably and/or movably provided with the substrate in a horizontal direction, a sensing device for sensing the substrate fixed to the stage and controlling the movement of the stage to align the substrate, and an optical device, i.e., optics, for crystallizing the silicon by irradiating laser beams onto the substrate.

In the invention, the optical device includes a laser beam generator to generate laser beams, a focusing lens to focus the laser beams, a mask to dividedly irradiate the focused laser beams onto the substrate when forming alignment keys, a crystallization mask to selectively irradiate the focused laser beams onto the substrate when performing a crystallization process, and a reduction lens to reduce the laser beams passing through the mask to form of the alignment keys and the crystallization mask.

In the invention, the stage can include a moving stage for being moved in a horizontal direction, a fixing plate provided in the moving stage so as to fix the substrate, a rotating frame provided in the moving stage so as to rotate the fixing plate, multiple adsorption pins provided in the fixing plate for being moved up and down, and a vacuum groove provided in the surface of the fixing plate.

Also, the sensing device senses the corner coordinates of the substrate. The sensing devices include at least first, second, and third sensors. The first and second sensors can be positioned to correspond with the two corner coordinates of the long length-side direction of the substrate, and the third sensor is positioned to correspondence with the corner coordinates of the short width-side direction of the substrate. The first, second, and third sensors can be formed of CCD cameras, or the first, second, and third sensors can bee formed of LD sensors.

The invention, in part, pertains to a silicon crystallization method that includes providing a silicon crystallization apparatus including optics, i.e., an optical device, for generating laser beams, a stage for fixing a substrate having silicon deposited thereon, the stage being rotatably and movably provided with the substrate in a horizontal direction, and a sensing device for sensing the position of the substrate. The method also includes forming an amorphous silicon layer over an entire surface of the substrate defined as a display area and a non-display area, fixing the substrate to the stage, aligning the substrate by sensing the substrate fixed on the stage with the sensing means, and moving and rotating the stage, forming alignment keys on predetermined portions of the non-display area of the substrate by correspondingly placing a mask for formation of alignment keys above the substrate, and crystallizing the amorphous silicon by correspondingly placing a mask for crystallization above the substrate.

In the invention, the process of aligning the substrate includes positioning first and second sensors to correspond with the corner coordinates of a length-side direction of the substrate, and positioning a third sensor to correspond with the corner coordinates of a width-side direction of the substrate, according to the size of the substrate. The method also includes detecting the corner coordinates of the substrate with the first, second, and third sensors, and moving the stage along the X-axis and the Y-axis directions, and/or rotating the stage, so as to detect the corner coordinates of the substrate from all of the first, second, and third sensors.

In the invention, the method of moving the stage along the X-axis and the Y-axis directions, and of rotating the stage, can also include steps of minutely moving the stage along the (+)(−)X-axis direction so as to sense the corner coordinates of the substrate from the third sensor, if the corner coordinates of the substrate are detected from the first and second sensors, and not detected from the third sensor. Then, the method minutely moves the stage along the (+)(−)Y-axis direction so as to sense the corner coordinates of the substrate from the first and second sensors, if the corner coordinates of the substrate are detected from the third sensor, and not detected from the first and second sensors. Afterwards, the method rotates the stage so as to sense the corner coordinates of the substrate from both the first and second sensors, and moves the stage along the (+)(−)X-axis direction so as to sense the corner coordinates of the substrate from the third sensor, if the corner coordinates are detected from any one of the first and second sensors.

In a preferred embodiment, the alignment key is formed in shape of '¬'. Also, when forming the alignment keys, the laser beam is irradiated at a first energy density at an intensity suitable for ablating the amorphous silicon layer. When performing the crystallization process, the laser beams is irradiated at a second energy density at an intensity sufficient to completely melt the amorphous silicon layer.

In the invention, the process of crystallizing the amorphous silicon layer is performed using a first step of selectively crystallizing predetermined portions of the display area, and a second step of crystallizing a driving circuit part of the non-display area.

The invention, in part, pertains to a silicon crystallization method that includes providing a silicon crystallization apparatus including optical means for generating laser beams, a stage for fixing a substrate having silicon deposited thereon, and for being rotatably and movably provided with the substrate in a horizontal direction, and a sensing device for sensing the position of the substrate. The method includes steps of forming an amorphous silicon layer over an entire surface of the substrate defined as a display area and a non-display area, fixing the substrate to the stage, aligning the substrate by sensing the substrate fixed on the stage with the sensing means, and moving and rotating the stage. The method further includes forming alignment keys on predetermined portions of the non-display area by correspondingly providing a mask for formation of alignment key above the substrate, crystallizing the amorphous silicon on predetermined portions of the display area by correspondingly placing a first crystallization mask above the substrate, and crystallizing the amorphous silicon of the non-display area by correspondingly placing a second crystallization mask above the substrate.

In the invention, the process of crystallizing the amorphous silicon with the first crystallization mask is performed while sensing an interval between the alignment key and the predetermined portion of the substrate irradiated with the laser beams. Also, the first crystallization mask contains an open part and a closed part, and a length and a width in the open part of the first crystallization mask are controlled according to a size of a semiconductor layer in each pixel. The first crystallization mask can include at least one pattern block corresponding to a semiconductor layer part in each pixel. Further, the process of crystallizing the amorphous silicon with the second crystallization mask is performed while sensing an interval between the alignment key and the predetermined portion of the substrate irradiated with the laser beams.

It is to be understood that both the foregoing general description and the following detailed description of the invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE INVENTION

Reference will now be made in detail to the preferred embodiments of the invention, examples of which are illustrated in the accompanying drawings. Wherever possible, the same reference numbers will be used throughout the drawings to refer to the same or like parts.

Hereinafter, a silicon crystallization apparatus and a silicon crystallization method according to the invention will be described with reference to the accompanying drawings.

Figure 6:
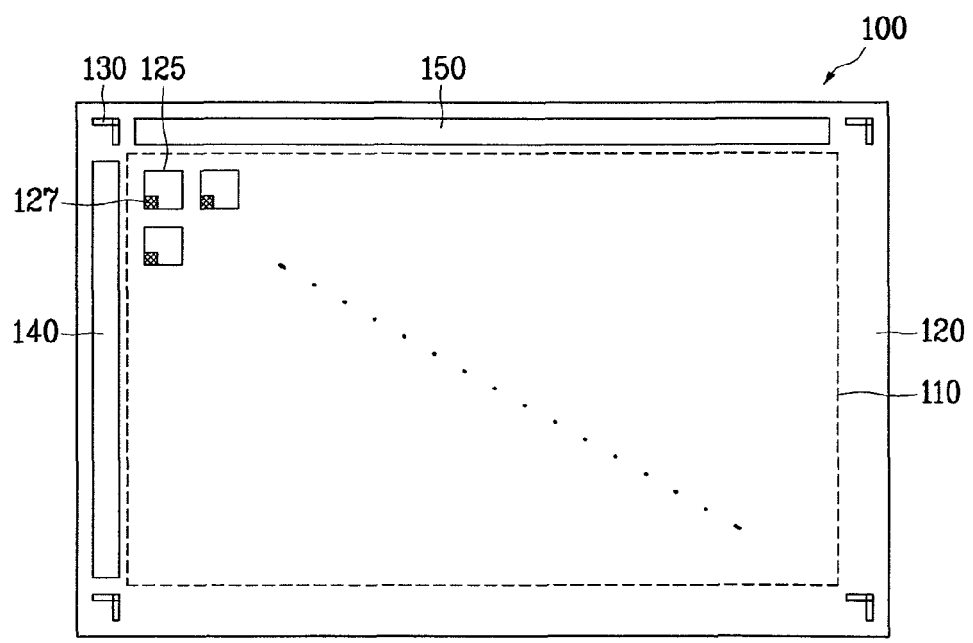
FIG. 6 illustrates a plane view of respective regions formed on a substrate according to an embodiment of the invention.

FIG. 6 illustrates a plane view of respective regions formed on a substrate according to the invention. FIG. 6 shows a substrate 100 for a thin film transistor array of an LCD device is defined as a display area 110 for displaying a substantial image, and a non-display area 120 surrounds the display area 110. An amorphous silicon layer is deposited over the entire surface of the substrate 100.

On the display area 110, multiple gate and data lines (not shown, positioned in portions except pixel regions of the display area) crossing each other are formed to define the pixel regions 125, and a pixel electrode is formed in each of the pixel regions 125. Also, a thin film transistor is formed at a crossing portion of the gate and data lines in a predetermined portion of the pixel region 125, where the thin film transistor is formed from a gate electrode (not shown) protruding from the gate line, a source electrode (not shown) protruding from the data line, and a drain electrode (not shown) provided at a predetermined interval from the source electrode. In addition, a semiconductor layer 127 is formed below the source electrode and the drain electrode so as to form a channel between them.

A driving circuit part of a gate driver 140 and a source driver 150 is formed over the non-display area 120 so as to apply signals to the respective gate and data lines of the display area 110.

Also, an alignment key 130 is formed over the substrate 100. The alignment key 130 is used for patterning crystalline silicon in the semiconductor layer, or for sensing an exposure area of the substrate by photolithography to form the gate line, the data line, or the pixel electrode.

This alignment key 130 may be additionally formed by photolithography. However, the inventive silicon crystallization method can have the alignment key 130 being formed by irradiating a laser beam at each corner of the non-display area 120 at an energy density suitable for ablation of the amorphous silicon layer during the silicon crystallization process. In this case, the alignment key 130 formed during the silicon crystallization process may be used several times for the following photolithography.

Figure 7:
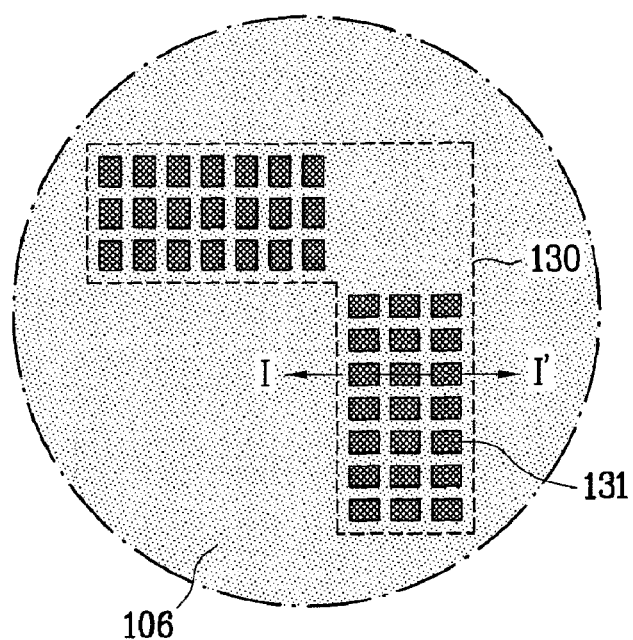
FIG. 7 illustrates an expanded plane view of an alignment key of FIG. 6 according to an embodiment of the invention.
Figure 8:
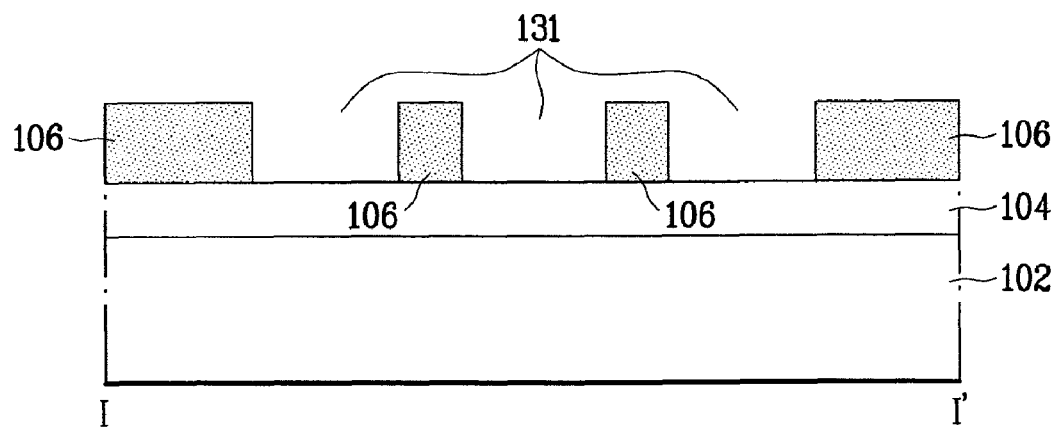
FIG. 8 illustrates a cross sectional view of an alignment key along I-I' of FIG. 7 according to an embodiment of the invention.

FIG. 7 illustrates an expanded plane view of the alignment key of FIG. 6 according to the invention. FIG. 8 illustrates a cross sectional view of the alignment key along I-I' of FIG. 7 according to the invention.

As shown in FIG. 7 and FIG. 8, the alignment key 130 is formed with a mask (not shown), the mask for formation of the alignment key preferably having a shape of '⌐'. The alignment key is not restricted to the shape of '⌐' and other appropriate shapes can be used. These shapes can include but are not restricted to 'ㄴ', 'ㄷ', 'ㄹ', 'ㅁ', 'ㅂ', 'ㅋ', 'ㅍ', '+', '◇', 'ㄱ', 'ㅏ', 'ㅓ', '⊤', '十', '╬', 'ㅁ', '→', or '○'.

The energy density of laser beam is about at the intensity (or greater) of completely melting the amorphous silicon layer, and of removing the amorphous silicon layer irradiated with the laser beam by ablation. In this laser beam irradiation process, the alignment key 130 is defined not by completely removing an amorphous silicon layer of the preferred '⌐'-shaped pattern, but by removing a plurality of minute patterns 135 having a critical dimension (CD) down to about 0.1 μm or smaller in the '⌐'-shaped pattern.

Unlike the related art photolithography that removes or leaves a desired region by using a photosensitive pattern (photoresist pattern), the inventive alignment keys can be patterned by depositing a buffer layer 104 and the amorphous silicon layer 106 over an entire surface of the substrate 102, volatilizing a predetermined portion of the amorphous silicon layer 106 by increasing the intensity of laser beam irradiation, forming multiple minute patterns 131 in intaglio, and defining the alignment key 130 of '⌐' shape with the plurality of minute patterns 131 (see FIG. 8). At this time, the alignment key 130 may be formed in shape of 'ㄴ', 'ㄷ', 'ㄹ', 'ㅁ', 'ㅂ', 'ㅋ', 'ㅍ', '+', '◇', 'ㄱ', 'ㅏ', 'ㅓ', '⊤', '十', '╬', 'ㅁ', '→', or '○' by changing the pattern of the mask for forming the alignment key. However, the alignment key is not restricted to these shapes, and any appropriate shape can be used.

Figure 9:
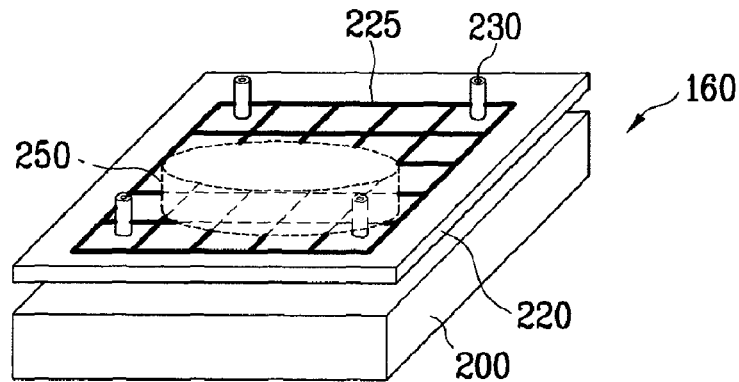
FIG. 9 illustrates a perspective view of a stage for a crystallization process according to an embodiment of the invention.

FIG. 9 illustrates a perspective view of a stage in a silicon crystallization apparatus for crystallizing amorphous silicon according to the invention. FIG. 9 shows a stage 160 of a silicon crystallization apparatus for crystallizing amorphous silicon that is provided with a moving stage 200, a fixing plate 220, pins 230, a rotating frame 250, and a vacuum groove 225. The moving stage 200 moves a loaded substrate (not shown) in all directions, and the fixing plate 220 fixes the loaded substrate (not shown). Also, the pins 230 are provided at corners of the fixing plate 220, and the pins 230 are moved upward and downward so as to adsorb the loaded substrate. The rotating frame 250 rotates the fixing plate 220 to adjust the loaded substrate to a correct position without deviation or sliding. The vacuum groove 225 is provided on the surface of the fixing plate 220 to fix the substrate to the fixing plate 220 without leaving any gap.

When the substrate is loaded on the fixing plate 220, the pins 230 project above the fixing plate 220 to fix the loaded substrate. Then, the pins 230 move downward to adsorb the loaded substrate, so that the loaded substrate is fixed to the surface of the fixing plate 220. In this case, the vacuum groove 225 uniformly formed on the surface of the fixing plate 220 adsorbs the loaded substrate with the pins 230 by using a vacuum, and the loaded substrate is thus fixed to the surface of the fixing plate 220 without a gap. The vacuum groove 225 is preferably formed in a lattice shape.

When loading the substrate to the stage 160, the substrate may deviate or slide, so that the substrate may not be positioned at the correct corresponding position of the stage 160. To correct this problem, the stage 160 has the rotating frame 250 for adjusting the substrate in case the substrate deviates or slides, so that it is possible to adjust the loaded substrate by minutely rotating or moving the fixing plate 220 at all directions.

Due to the spatial limitations in advancing the crystallization process, the laser beam irradiation area by the mask pattern corresponds to the predetermined portion of the substrate, whereby the moving stage 200 moves the stage 160 bearing the substrate in one direction. Alternately, rotating the stage 160 bearing the substrate at an angle of 90° progresses the crystallization process. In this case, the moving stage 200 may move the stage 160 along both the X-axis and Y-axis directions.

Figure 10:
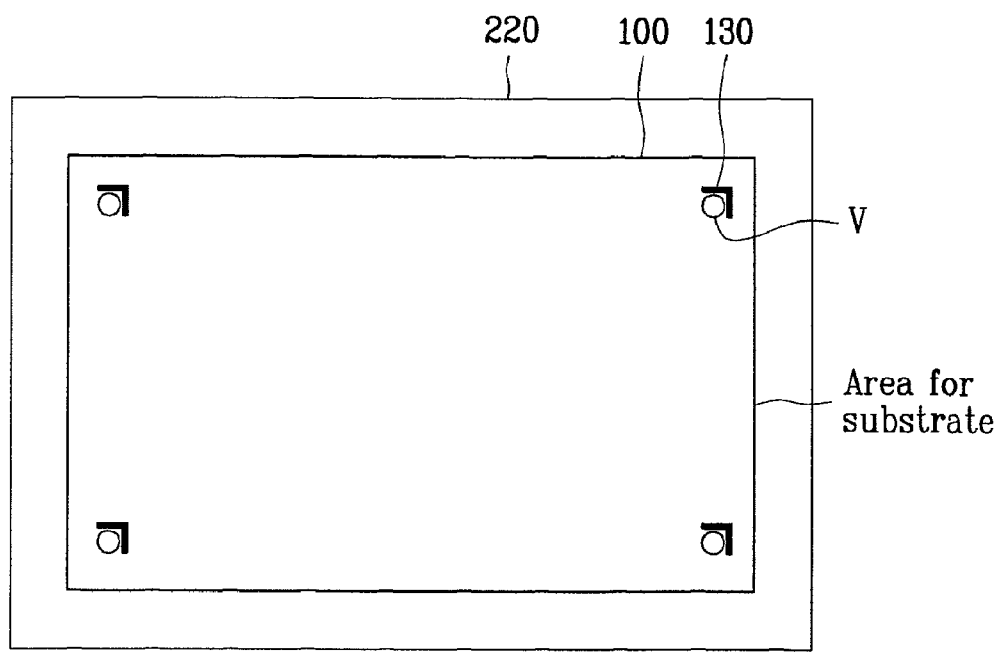
FIG. 10 illustrates a plane view of a substrate loaded on a correct position of a stage according to an embodiment of the invention.

FIG. 10 illustrates a plane view of the substrate correctly loaded on the desired position of the stage. FIG. 10 shows that if the substrate 100 is loaded at the correct portion of the fixing plate 220 of the stage 160, the alignment keys 130 formed in four corners of the substrate 100 correspond with the portions V for the pins formed at four corners of the stage.

However, when loading the substrate 100 on the fixing plate 220, the substrate 100 may generally deviate or slide. Accordingly, the alignment keys 130 formed in four corners of the substrate 100 may not correspond with the portions V for the pins formed in four corners of the stage.

A case adjusting the substrate loaded to the fixing plate will be described with reference to the accompanying drawings.

Figure 11:
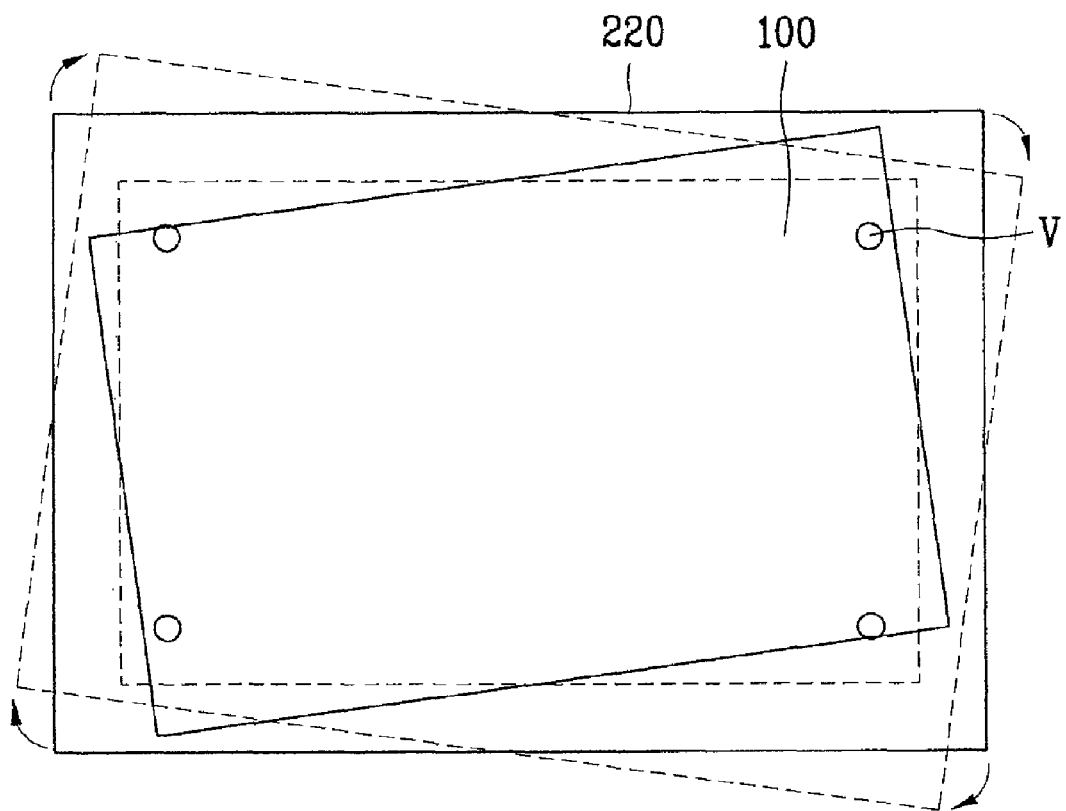
FIG. 11 illustrates a plane view of a case for loading a substrate deviated from a fixation plate according to an embodiment of the invention.
Figure 12A:
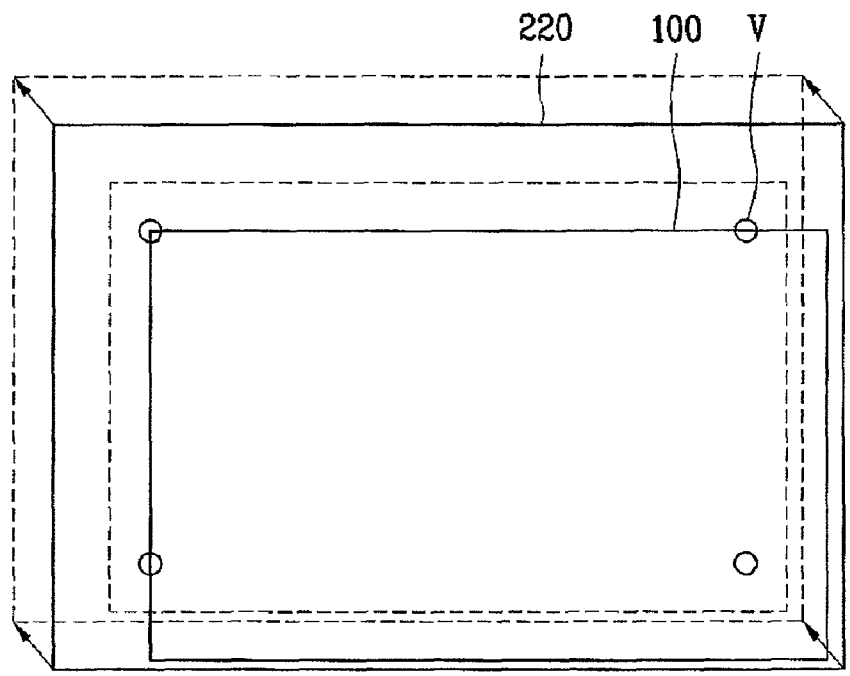
FIG. 12A and FIG. 12B illustrate plane views of a case a substrate slides on a fixing plate according to an embodiment of the invention.
Figure 12B:
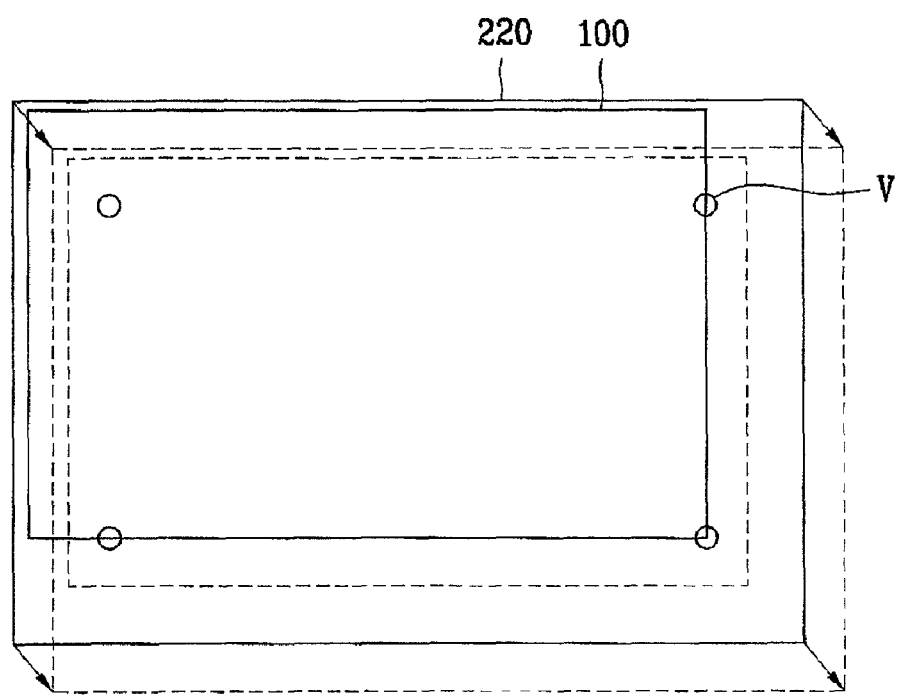

FIG. 11 illustrates a plane view of a case for loading the substrate deviated from the fixing plate according to the invention. FIG. 12A and FIG. 12B illustrate plane views of the situation where the substrate slides on the fixing plate according to the invention.

FIG. 11 shows that when the substrate 100 is externally loaded on the fixing plate 220 of the stage, the substrate 100 may deviate from the correct position of the fixing plate due to the external force.

Also, as shown in FIG. 12A and FIG. 12B, when the substrate 100 is externally loaded on the fixing plate 220, the substrate 100 is transferred to the fixing plate 220 by a robot arm. In this case, the substrate 100 may not stop at the correct position on the fixing plate due to the speed, and thus the four corners of the substrate 100 may not be positioned to correspond with the portions V for the pins. That is, the substrate 100 may slide relative to the correct area of the fixing plate 220. FIG. 12A illustrates the situation where the substrate slides down toward the right side relative to the portions V for the pins of the stage. FIG. 12B illustrates the situation where the substrate slides up toward the left side relative to the portions V for the pins of the stage.

In the cases of FIG. 11, FIG. 12A, and FIG. 12B, there are requirements for rotating the fixing plate in a clockwise direction, or moving the stage to the northwest or southeast (i.e., diagonal) direction to thereby aligning the substrate. Especially, for the inventive silicon crystallization method, the crystallization process is selectively performed at predetermined portions of the substrate instead of over the entire surface of the substrate. In this respect, it becomes necessary to sense the deviation or the sliding of the substrate, and to adjust the substrate to the correct position. As a result, the crystallization process is correctly performed at selected portions of the substrate.

A silicon crystallization apparatus having additional position sensors above the stage will be described as follows.

Figure 13:
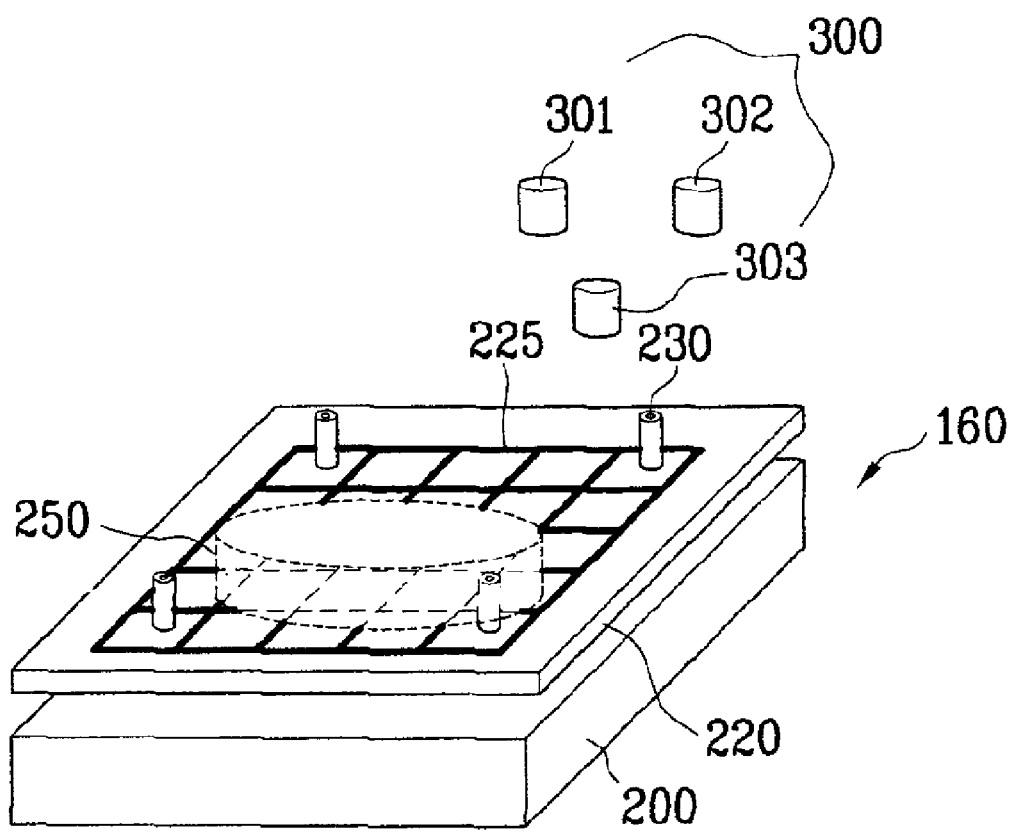
FIG. 13 illustrates a perspective view of a silicon crystallization apparatus according to the first embodiment of the invention.

FIG. 13 illustrates a perspective view of a silicon crystallization apparatus according to the first embodiment of the invention. FIG. 13 shows a silicon crystallization apparatus that is provided with optics (not shown), a fixing plate 220 and adsorption pins 230 of a stage 160, a sensing device 300, and an adjusting mechanism 250. At this time, the optics (not shown) irradiates a laser beam to predetermined patterns of a substrate. Then, the substrate is loaded on the stage 160 by the fixing plate 220 and the adsorption pins 230 using vacuum adsorption. Also, the sensing device 300 is provided to sense the position of the substrate loaded to the fixing plate 220, and the adjusting mechanism 250 adjusts the substrate deviated from or sliding on the fixing plate 220. As explained above, the adjusting mechanism is preferably formed from a rotating frame 250.

The optics is provided with a laser beam generator for irradiating a laser beam, a condensing lens for condensing the laser beam, a mask for forming alignment keys to correspond with selected portions, a mask for a crystallization process, and a reducing lens for reducing the laser beam transmitted by the masks for the alignment keys and crystallization process. The optics thus transmit laser beam patterns. The optics are provided above the stage 160 when loading the substrate 100, so as to irradiate the laser beam at the corresponding patterns of the substrate 100 by using the mask for making the alignment keys or the mask for the crystallization process.

The stage of FIG. 13 has the same structure as that of FIG. 9.

Here, the adsorption pins 230 move up and down. That is, when the substrate 100 is loaded to the fixing plate 220 by a loader (not shown), the adsorption pins 230 move up to fix the substrate. When the loader unloads the substrate, the adsorption pins 230 move down so as to move the substrate downward, whereby the substrate is loaded on the surface of the fixing plate 220. After that, the substrate is fixed using a lattice-shaped vacuum groove 225 formed on the surface of the fixing plate 220.

The sensing device 300 senses the position of the substrate 100 so as to adjust the position of the deviated substrate by minutely moving the rotating frame 250, or to adjust the position of the slid substrate by moving the stage. The sensing device 300 may be a CCD (charge coupled device) camera or an LD (laser displacement) sensor. That is, three (or more) CCD cameras or LD sensors are provided in correspondence with the corners (or edges) of the substrate fixed to the fixing plate 220. The sensing device 300 is provided in the optics, and the sensing device 300 is perpendicular at a predetermined interval from the substrate 100. Also, each of the first, second, and third sensors 301, 302, and 303 of the sensing device 300 is provided at the same distance from the substrate 100. If using CCD cameras as the sensing device 300, the CCD cameras map the corners of the substrate. If using LD sensors as the sensing device 300, the LD sensors sense the step difference of the corners of the substrate using a laser scanning method.

FIG. 13 shows that the sensing device 300 is provided with the first, second, and third sensors 301, 302, and 303 (three CCD cameras or three LD sensors). The first and second sensors 301 and 302 are positioned to correspond with the two corners of the longer length-side direction of the substrate, and the third sensor 303 is positioned to correspond with one corner of the short width-side direction of the substrate. The substrate has a rectangular shape so that it is possible to sense the position of the substrate with the three CCD cameras or the three LD sensors.

The inventive silicon crystallization apparatus has the substrate being fixed to the fixing plate 220 by the adsorption pins 230 and the vacuum groove 225, and the position of the substrate is sensed with the sensing device 300. If the substrate deviates from the correct position, the rotating frame 250 operates to adjust the substrate. Also, if the substrate slides, the stage is moved along the X-axis and the Y-axis direction so as to adjust the substrate.

FIG. 14A to FIG. 14D illustrate the inventive silicon crystallization process using the silicon crystallization apparatus of FIG. 13.

First, the substrate 100 (which is defined into a display area and a non-display area) is prepared, and an amorphous silicon layer is formed over the entire surface of the substrate 100.

Figure 14A:
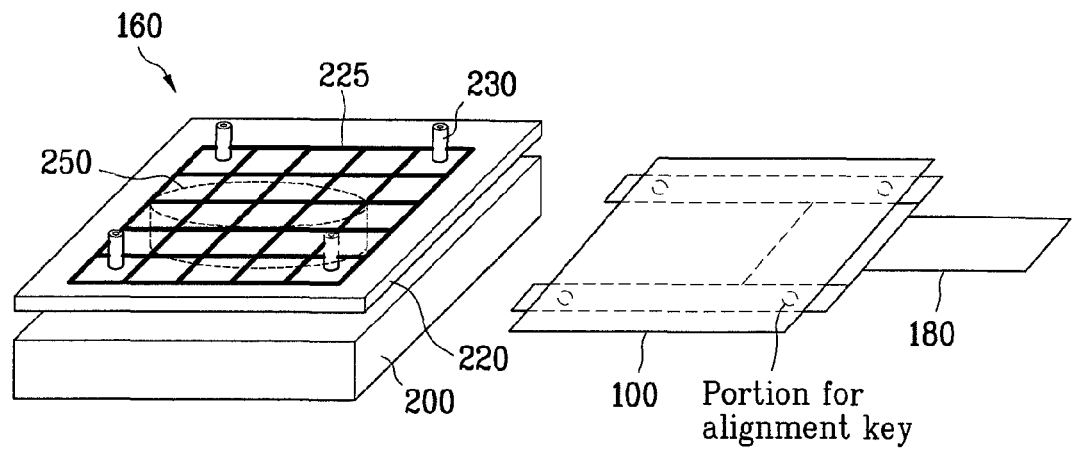
FIG. 14A to FIG. 14D illustrate a silicon crystallization process with a silicon crystallization apparatus of FIG. 13 according to an embodiment of the invention.
Figure 14B:
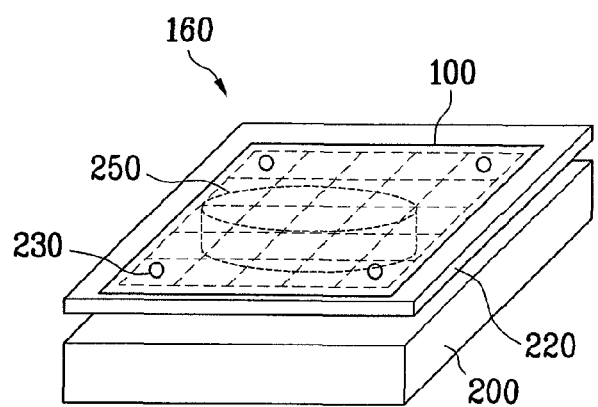

FIG. 14A shows that the substrate 100 is moved to the fixing plate 220 of the stage 160 by the loader 180. Then, as shown in FIG. 14B, when the substrate 100 is positioned above the fixing plate 220, the adsorption pins 230 move up to adsorb, i.e., support, the substrate 100, and then the loader 180 is retracted.

Afterwards, the adsorption pins 230 move down while supporting the substrate 100, so that the substrate 100 is loaded on the surface of the fixing plate 220. Then, the loaded substrate 100 is fixed to the fixing plate 220 using the vacuum groove 225.

Figure 14C:
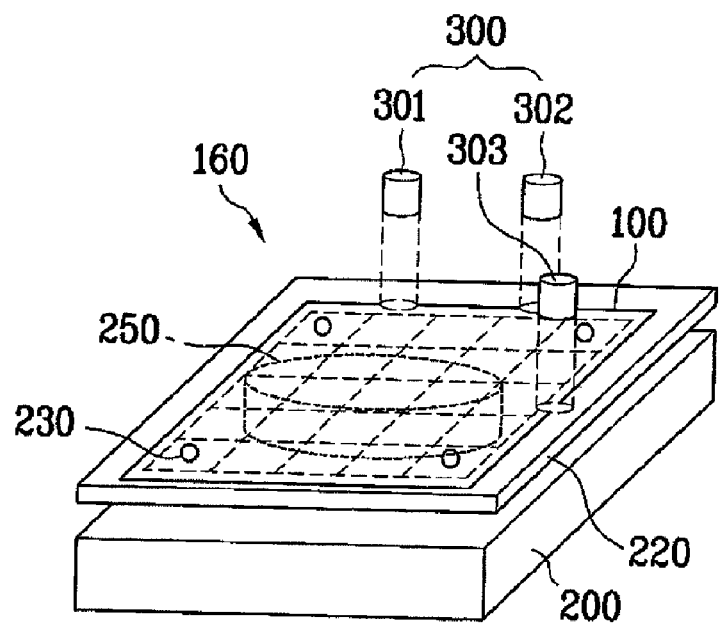

FIG. 14C shows the sensing device 300 sensing the position of the substrate 100 fixed to the fixing plate 220, so that it is possible to sense whether the substrate 100 deviates or slides from the correct position. That is, the first and second sensors 301 and 302 (two CCD cameras or two LD sensors) are provided to correspond with the two corners of the long length-side direction of the substrate, and the third sensor 303 (one CCD camera or one LD sensor) is provided to corresponds with one corner of the short width-side direction of the substrate. After fixing the substrate to the fixing plate 220, the substrate is checked to determine whether the corner coordinates are detected by the first, second, and third sensors 301, 302, and 303.

Figure 15:
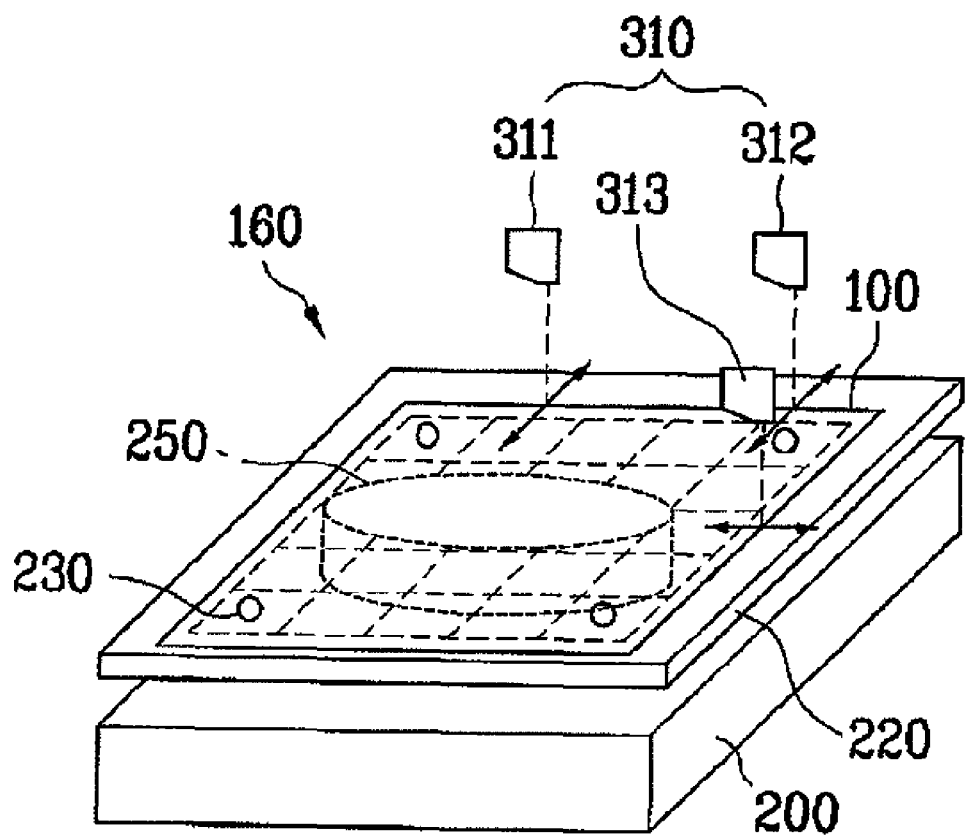
FIG. 15 shows a silicon crystallization apparatus using a laser diode sensor according to an embodiment of the invention.

FIG. 15 shows a variation of the configuration of FIG. 14C where the sensing device 300 senses the position of the substrate 100 fixed to the fixing plate 220, so that it is possible to sense whether the substrate 100 deviates or slides from the correct position. In this embodiment, the laser diode (LD) sensing device 310 has first and second sensors 311 and 312 (two LD sensors) are provided to correspond with the two corners of the long length-side direction of the substrate, and the third sensor 313 (one LD sensor) is provided to correspond with one corner of the short width-side direction of the substrate. After fixing the substrate to the fixing plate 220, the substrate is checked to determine whether the corner coordinates are detected by the first, second, and third LD sensors 311, 312, and 313.

If the corner coordinates of the substrate are sensed by the three sensors, the substrate is re-aligned with the sensed corner coordinates, thereby correctly aligning the substrate. That is, even if the corner coordinates of the substrate are detected, the substrate is re-aligned to the correct position. Also, if the corner coordinates of the substrate are not detected by all three sensors, the coordinates are determined as the substrate deviates or slides. The moving stage 200 is accordingly moved along the X-axis direction and the Y-axis direction, so that the corner coordinates of the substrate are detected by all the three sensors.

If the first and second sensors 301 and 302 provided in the long length-side direction of the substrate sense the corner coordinates of the substrate, and if the third sensor 303 provided in the short width-side direction of the substrate doesn't sense the corner coordinates of the substrate, then the moving stage 200 is minutely moved along the (+)(−) X-axis direction so that the third sensor 303 senses the corner coordinates of the substrate.

Also, if the corner coordinates of the substrate are sensed only by the third sensor 303 provided in the short width-side direction of the substrate, and if the corner coordinates of the substrate are not sensed by the first and second sensors 301 and 302 provided in the long length-side direction of the substrate, then the moving stage is minutely moved along the (+)(−) Y-axis direction so that the first and second sensors 301 and 302 sense the corner coordinates of the substrate.

By moving the moving stage 200, the corner coordinates are sensed by any one of the first and second sensors 301 and 302, and it is determined if the substrate deviates from the correct position. In this situation, the rotating frame 250 operates so that the corner coordinates of the substrate are sensed in both the first and second sensors 301 and 302, thereby adjusting the substrate to the correct position. Also, by moving the moving stage 200, the corner coordinates of the substrate are sensed by the third sensor 303.

After aligning the substrate fixed to the fixing plate 220, the mask (not shown) for forming the alignment keys is positioned above the substrate 100. The alignment key pattern is preferably formed in shape of '⌐'

Figure 14D:
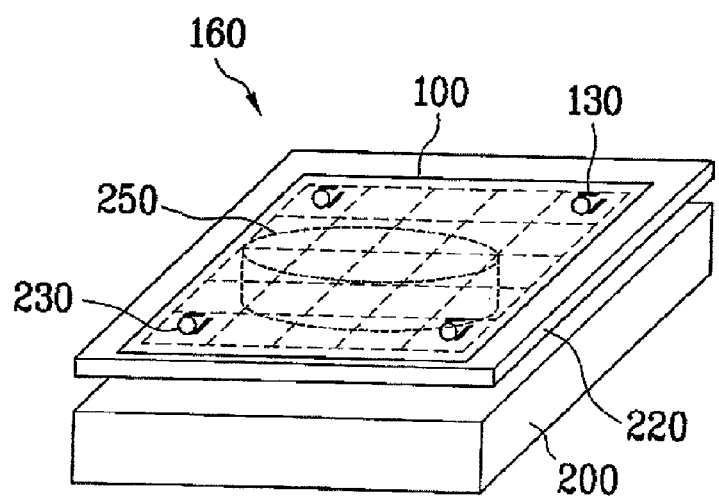

Subsequently, as shown in FIG. 14D, the laser beam is irradiated at a first energy density at predetermined portions of the non-display area through the mask for forming the alignment keys, thereby forming the alignment keys 130. The alignment keys 130 correspond with the corners of the substrate 100. In this case, the substrate is pre-aligned according to the process discussed above, and then the substrate is placed at the correct position by using the alignment keys 130.

At this time, the first energy density of laser beam is adjusted to the intensity of completely ablating the amorphous silicon layer. That is, the laser beam irradiates at the energy density required to completely melt the amorphous silicon layer (third region of FIG. 1), so that the amorphous silicon layer of the substrate 100 corresponding to the preferred '⌐'-shaped pattern of the mask is not crystallized, so as to be ablated as a number of minute patterns having a critical dimension CD down to about 1 μm or smaller.

Subsequently, the mask (not shown) for the silicon crystallization process is positioned above the substrate 100. Then, the laser beam is irradiated at a second energy density at the substrate 100 through the mask, thereby performing the crystallization process. In this case, the silicon crystallization process using the mask may be entirely performed on the substrate without division. Alternately, the silicon crystallization process may be selectively performed on the substrate by the sequential process of crystallizing the semiconductor layer of the display area ('127' of FIG. 6), and by crystallizing the driving circuit part of the non-display area.

In the latter case of the selective silicon crystallization process, the interval between the laser beam irradiation portion of the substrate 100 and the alignment key 130 is sensed with the alignment keys 130 formed at the corners of the substrate 100.

In both the entire and selective silicon crystallization process, the alignment keys 130 are formed before the crystallization process, and the alignment keys are used for a patterning process proceeding after the crystallization process.

The second energy density is set at the energy density (third region of FIG. 1) necessary to completely melt the amorphous silicon layer, so as to be suitable for SLS (sequential lateral solidification).

Although not shown, the mask for the silicon crystallization process is provided with alternately formed open parts and closed parts.

For the latter case of the selective silicon crystallization process, the length and width of the mask for the silicon crystallization process is controlled in accordance with the size of the semiconductor layer of the pixel regions formed on the substrate. The length and width of the semiconductor layer formed on the pixel regions are within several tens of μm, whereby the open part of the mask has a smaller length than that of a general mask for the crystallization process.

If the crystallization process is performed on the semiconductor layer part of the display area and the driving circuit part of the non-display area by using one mask for the crystallization process, then the number of laser irradiations required for crystallizing the driving circuit part increases because the open part of the mask has a small size. Accordingly, in addition to the mask for the crystallization process to the display area, there is a requirement for providing a mask having a longer open part, thereby simplifying the laser beam irradiation process.

Figure 1:
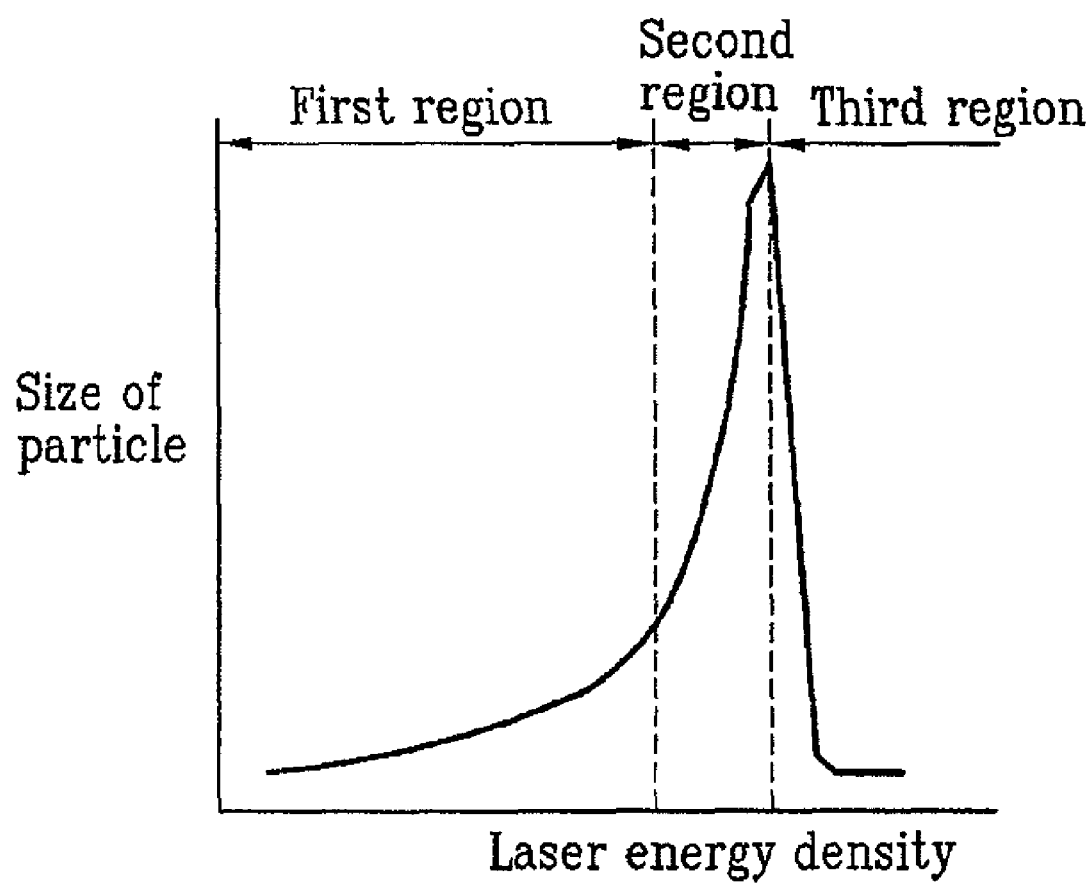
FIG. 1 illustrates a graph showing the size of amorphous silicon particles versus laser energy density.
Figure 2:
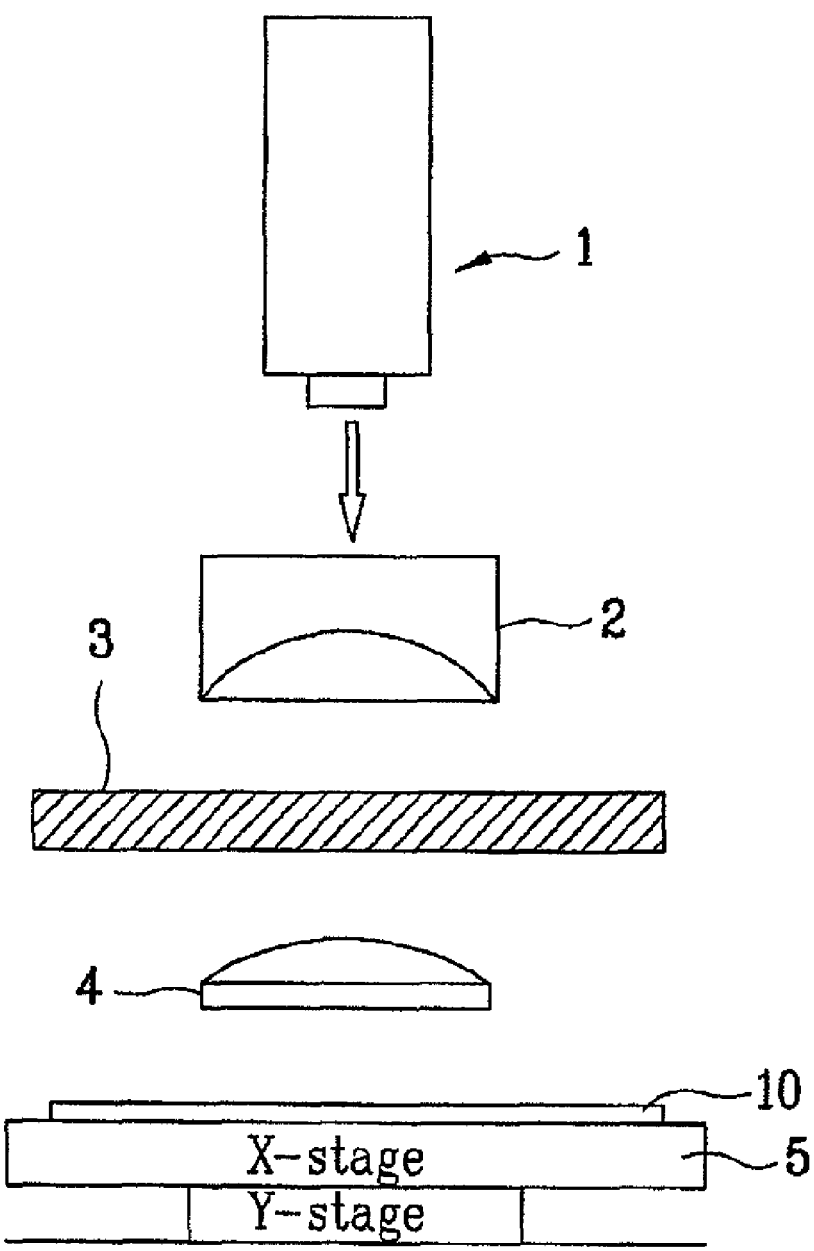
FIG. 2 illustrates a schematic view of a related art laser irradiation apparatus for a general SLS method.
Figure 3:
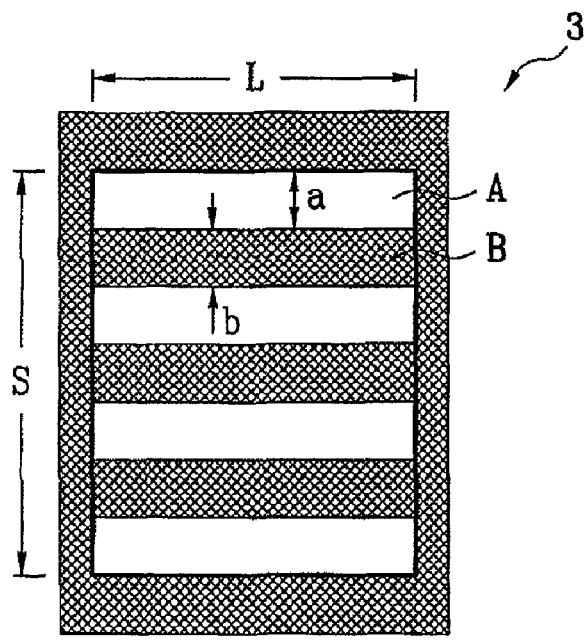
FIG. 3 illustrates a plane view of a related art mask used in a laser irradiation process.
Figure 4:
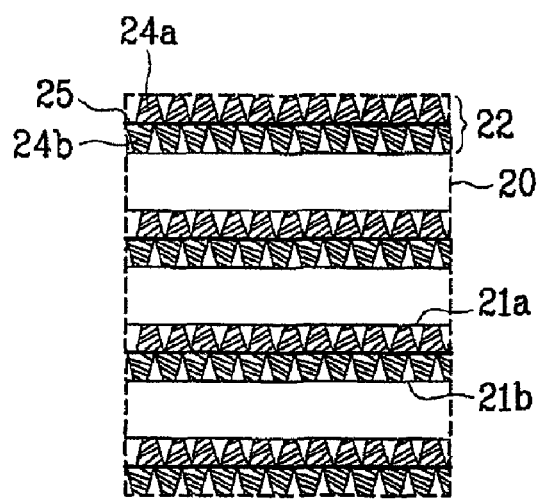
FIG. 4 illustrates a crystallized area formed by a first laser beam irradiation with a mask of FIG. 3.
Figure 5:
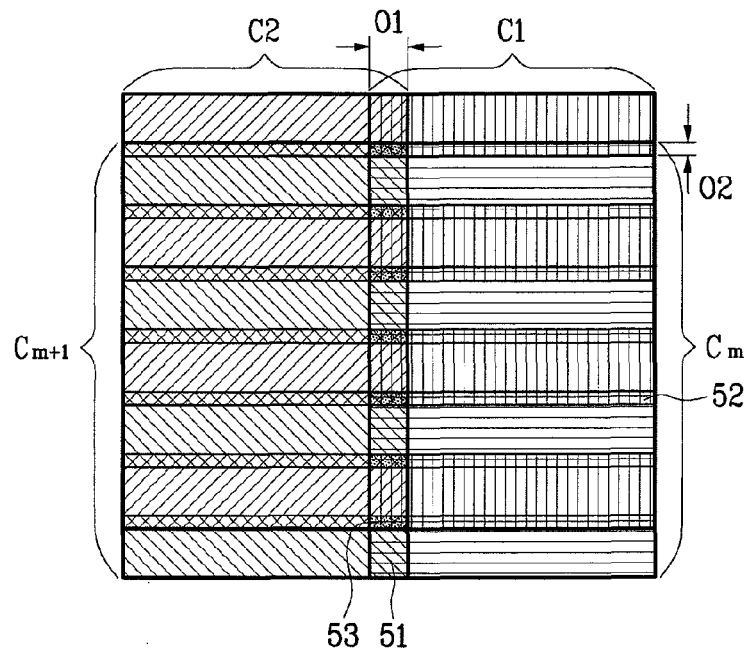
FIG. 5 illustrates a laser beam overlapped portion formed on a predetermined area after performing a crystallization process over an entire surface of a substrate.

Both the first energy density for the alignment keys and the second energy density for the crystallization process are set at the energy density corresponding to the third region of FIG. 1. However, the slit width (about 10 μm) of the mask for the alignment keys is relatively larger than the slit width (about 2-3 μm) of the mask for the crystallization process. In this respect, even though the laser beam having the same energy is irradiated, the irradiated magnitude of the laser beam for forming the alignment keys is usually greater than the irradiation magnitude of the laser beam used for the crystallization process.

After completing the crystallization process, the adsorption force of the fixing plate 220 is removed, and the adsorption pins 230 move up, whereby the substrate 100 moves apart from the fixing plate 220. Then, as explained above, the loader 180 is positioned between the substrate 100 and the fixing plate 220, and the crystallized substrate is unloaded.

Another crystallizing method will be described as follows.

First, a substrate defined into a display area and a non-display area is prepared, and an amorphous silicon layer is formed over the entire surface of the substrate.

As shown in FIG. 14A, the substrate 100 is positioned above the fixing plate 220 of the stage 160. Then, as shown in FIG. 14B, the substrate 100 is fixed to the fixing plate 220 by using the adsorption pins 230 and the vacuum groove 225. After that, as shown in FIG. 14C, the corner coordinates of the substrate are sensed with the sensing device 300. According to the sensing results, the moving stage 200 is moved along the X-axis direction and the Y-axis direction, and the rotating frame 250 is operated to align the substrate, whereby the deviated or slid substrate is aligned.

Subsequently, the mask (not shown) for forming the alignment keys is correspondingly placed above the substrate 100. Then, as shown in FIG. 14D, the laser beam irradiates at a first energy density toward the predetermined portions of the non-display area through the mask for forming the alignment keys, thereby forming the alignment keys 130.

Then, the first crystallization mask (not shown) is correspondingly provided above the substrate. After that, the laser beam irradiates at a second energy density toward the predetermined portion of the display area through the first crystallization mask. At this time, during the crystallization process using the first crystallization mask, the laser beam is irradiates while sensing the interval between the predetermined portions of the substrate irradiated with laser beam and the alignment keys.

The predetermined portions of the display area corresponding to the first crystallization mask are formed from the semiconductor layer part.

The first crystallization mask has at least one pattern block corresponding to the semiconductor layer part. That is, when the first crystallization mask has multiple pattern blocks corresponding to the semiconductor layer part, the pattern blocks of the first crystallization mask are provided to have the laser beam irradiation portions being spaced in correspondence with the pixel intervals. This spacing is in due consideration of the reducing ratio of the first crystallization mask to the substrate 100. The pattern blocks have the corresponding size of the semiconductor layer part, wherein multiple open and closed parts are alternately provided.

In the pattern blocks of the first crystallization mask, the length and width of the first crystallization mask is controlled in accordance with the size of the semiconductor layer of the pixel regions formed on the substrate. Usually, the length and width of the semiconductor layer formed on the pixel regions are within several tens of μm, whereby the open part of the mask has a smaller length than that of the general mask used for the crystallization process.

Subsequently, the second crystallization mask is placed above the substrate. The second crystallization mask also has multiple alternate open and closed parts. At this time, the open part has a width of several tens of μm, and the open part has a length of about several mm to several thousand mm.

Afterwards, the laser beam irradiates at a second energy density toward the driving circuit part of the non-display area through the second crystallization mask. The laser beam irradiates while sensing the interval between the predetermined portions of the substrate irradiated with laser beam and the alignment keys. In this case, it is unnecessary to check the interval between the alignment keys 130 and the laser beam irradiated portions of the substrate whenever the laser beam is irradiated. That is, the interval between the alignment keys and the substrate irradiated with the laser beam is checked at the start point and the end point of the laser beam irradiated in one direction.

This crystallization method uses the same process as that of the former crystallization method, except that this crystallization method separately performs the crystallization process for the semiconductor layer part of the display area and the driving circuit part of the non-display area using the two masks.

After completing the crystallization process, the adsorption force of the fixing plate 220 is removed, and the adsorption pins 130 move up, whereby the substrate 100 moves apart from the fixing plate 220. Then, as explained above, the loader 180 is positioned between the substrate 100 and the fixing plate 220, and the crystallized substrate is removed.

Accordingly, the silicon crystallization apparatus and the silicon crystallization method of the invention have the following advantages.

In the inventive silicon crystallization apparatus, the sensing device is provided to determine whether the substrate deviates or slides. After determining the position of the substrate, the substrate is aligned by moving the stage or operating the rotating frame, whereby the alignment keys are formed at the correct positions.

Without the additional photolithography, a laser beam having high energy density is irradiated through the mask to form the alignment keys before performing the crystallization process, thereby forming the alignment keys by ablating predetermined portions of the amorphous silicon layer. The alignment keys may be used for all the processes entailing patterning after the crystallization process, without an additional process for forming the alignment keys.

Also, since the alignment keys are formed after pre-aligning, the alignment keys are easily recognizable in an exposure apparatus.

Furthermore, even though the different substrates are loaded, it becomes possible to form the alignment keys at the same position in each substrate. Accordingly, if there is a requirement to selectively crystallize the divided areas, it becomes possible to selectively perform the crystallization process on the substrate with the alignment keys, in due consideration of the interval.

It will be apparent to those skilled in the art that various modifications and variations can be made in the invention without departing from the spirit or scope of the invention. Thus, it is intended that the invention covers the modifications and variations of this invention provided they come within the scope of the appended claims and their equivalents.

What is claimed is:

1. A silicon crystallization method, which comprises:
   providing a silicon crystallization apparatus including an optical device for generating laser beams, a stage for fixing a substrate having silicon deposited thereon, for being rotatably and movably provided with the substrate in a horizontal direction, and a sensing device provided in the optical device for sensing the position of the substrate;
   forming an amorphous silicon layer over an entire surface of the substrate defined as a display area and a non-display area;
   fixing the substrate to the stage;
   aligning the substrate by sensing the fixed substrate with the sensing device, and moving and/or rotating the stage, wherein the sensing device faces toward an edge of the substrate to directly sense the edge of the substrate;
   forming alignment keys on predetermined portions of the non-display area of the substrate by correspondingly placing a mask for formation of alignment key above the substrate; and
   crystallizing the amorphous silicon by correspondingly providing a mask for crystallization above the substrate.

2. The silicon crystallization method of claim 1, wherein the sensing device includes at least first, second, and third sensors;
   wherein the process of aligning the substrate includes:
   positioning the first and second sensors to correspond with the corner coordinates of a length-side direction of the substrate, and positioning the third sensor to correspond with corner coordinates of a width-side direction of the substrate, according to the size of the substrate;
   detecting the corner coordinates of the substrate with the first, second, and third sensors; and
   moving the stage along the X-axis and the Y-axis directions, and/or rotating the stage, so as to detect the corner coordinates of the substrate from all of the first, second, and third sensors.

3. The silicon crystallization method of claim 2, wherein the method of moving the stage along the X-axis and the Y-axis directions, and of rotating the stage, includes:
   minutely moving the stage along a positive X-axis and a negative X-axis direction so as to sense the corner coordinates of the substrate from the third sensor, if the corner coordinates of the substrate are detected from the first and second sensors, and not detected from the third sensor;
   minutely moving the stage along a positive Y-axis and a negative Y-axis direction so as to sense the corner coordinates of the substrate from the first and second sensors, if the corner coordinates of the substrate are detected from the third sensor, and not detected from the first and second sensors; and
   rotating the stage so as to sense the corner coordinates of the substrate from both the first and second sensors, and moving the stage along a positive X-axis and a negative X-axis direction so as to sense the corner coordinates of the substrate from the third sensor, if the corner coordinates are detected from any one of the first and second sensors.

4. The silicon crystallization method of claim 1, wherein the alignment key is formed in a shape 'L'.

5. The silicon crystallization method of claim 1, wherein, when forming the alignment keys, the laser beams irradiates at a first energy density.

6. The silicon crystallization method of claim 5, wherein the first energy density is set at an intensity suitable for ablating the amorphous silicon layer.

7. The silicon crystallization method of claim 1, wherein, when performing the crystallization process, the laser beams irradiates at a second energy density.

8. The silicon crystallization method of claim 7, wherein the second energy density is determined as an intensity to completely melt the amorphous silicon layer.

9. The silicon crystallization method of claim 1, wherein the process of crystallizing the amorphous silicon layer is performed using a first step of selectively crystallizing predetermined portions of the display area, and a second step of crystallizing a driving circuit part of the non-display area.

10. A silicon crystallization method, which comprises:
    providing a silicon crystallization apparatus including an optical device for generating laser beams, a stage for fixing a substrate having silicon deposited thereon, and for being rotatably and movably provided with the substrate in a horizontal direction, and a sensing device provided in the optical device, the sensing device facing toward an edge of the substrate to directly sense the edge of the substrate;
    forming an amorphous silicon layer over an entire surface of the substrate defined as a display area and a non-display area;
    fixing the substrate to the stage;
    aligning the substrate by sensing the substrate fixed on the stage with the sensing device, and moving and/or rotating the stage;
    forming alignment keys on predetermined portions of the non-display area by correspondingly providing a mask for formation of alignment key above the substrate;
    crystallizing the amorphous silicon on predetermined portions of the display area by correspondingly placing a first crystallization mask above the substrate; and
    crystallizing the amorphous silicon of the non-display area by correspondingly placing a second crystallization mask above the substrate.

11. The silicon crystallization method of claim 10, wherein the sensing device includes at least first, second, and third sensors;
    wherein the process of aligning the substrate includes:
    positioning the first and second sensors to correspond with the corner coordinates of a length-side direction of the substrate, and positioning the third sensor to correspond with the corner coordinates of a width-side direction of the substrate, according to the size of the substrate;
    detecting the corner coordinates of the substrate with the first, second, and third sensors; and
    moving the stage along the X-axis and the Y-axis directions, and/or rotating the stage, so as to detect the corner coordinates of the substrate from all of the first, second, and third sensors.

12. The silicon crystallization method of claim 11, wherein the method of moving the stage along the X-axis and the Y-axis directions, and of rotating the stage, includes:
    minutely moving the stage along a positive X-axis and a negative X-axis direction so as to sense the corner coordinates of the substrate from the third sensor, if the corner coordinates of the substrate are detected from the first and second sensors, and not detected from the third sensor;

minutely moving the stage along a positive Y-axis and a negative Y-axis direction so as to sense the corner coordinates of the substrate from the first and second sensors, if the corner coordinates of the substrate are detected from the third sensor, and not detected from the first and second sensors; and rotating the stage so as to sense the corner coordinates of the substrate from both the first and second sensors, and moving the stage along a positive X-axis and a negative X-axis direction so as to sense the corner coordinates of the substrate from the third sensor, if the corner coordinates are detected from any one of the first and second sensors.

13. The silicon crystallization method of claim 10, wherein the alignment key has a shape of 'L'.

14. The silicon crystallization method of claim 10, wherein, when forming the alignment keys, the laser beams irradiates at a first energy density.

15. The silicon crystallization method of claim 14, wherein the first energy density is set at an intensity suitable for ablating the amorphous silicon layer.

16. The silicon crystallization method of claim 10, wherein when performing the crystallization process, the laser beams irradiates at a second energy density.

17. The silicon crystallization method of claim 16, wherein the second energy density is set at an intensity of completely melting the amorphous silicon layer.

18. The silicon crystallization method of claim 10, wherein the process of crystallizing the amorphous silicon with the first crystallization mask is performed while sensing an interval between the alignment key and the predetermined portion of the substrate irradiated with the laser beams.

19. The silicon crystallization method of claim 10, wherein the first crystallization mask comprises an open part and a closed part, and a length and a width in the open part of the first crystallization mask are controlled according to a size of a semiconductor layer in each pixel.

20. The silicon crystallization method of claim 10, wherein the first crystallization mask includes at least one pattern block corresponding to a semiconductor layer part in each pixel.

21. The silicon crystallization method of claim 10, wherein crystallizing the amorphous silicon with the second crystallization mask is performed while sensing an interval between the alignment key and the predetermined portion of the substrate irradiated with the laser beams.

* * * * *